(12) United States Patent
Forbes et al.

(10) Patent No.: US 7,529,460 B2
(45) Date of Patent: May 5, 2009

(54) ZINC OXIDE OPTICAL WAVEGUIDES

(75) Inventors: Leonard Forbes, Corvallis, OR (US);
Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/717,463

(22) Filed: Mar. 13, 2007

(65) Prior Publication Data

US 2008/0226219 A1 Sep. 18, 2008

(51) Int. Cl.
*G02B 6/12* (2006.01)
*G02B 6/13* (2006.01)

(52) U.S. Cl. .................... 385/142; 385/14; 385/132

(58) Field of Classification Search .............. None
See application file for complete search history.

(56) References Cited

U.S. PATENT DOCUMENTS

| | | | | |
|---|---|---|---|---|
| 4,701,008 | A | * 10/1987 | Richard et al. | ............. 385/132 |
| 6,090,636 | A | 7/2000 | Geusic et al. | |
| 6,144,779 | A | * 11/2000 | Binkley et al. | ................. 385/8 |
| 6,150,188 | A | 11/2000 | Geusic et al. | |
| 6,526,191 | B1 | 2/2003 | Geusic et al. | |
| 6,723,577 | B1 | 4/2004 | Geusic et al. | |
| 6,777,715 | B1 | 8/2004 | Geusic et al. | |
| 6,829,421 | B2 | 12/2004 | Forbes et al. | |
| 6,898,362 | B2 | 5/2005 | Forbes et al. | |
| 6,950,585 | B2 | 9/2005 | Forbes et al. | |
| 6,995,443 | B2 | 2/2006 | Geusic et al. | |
| 7,054,532 | B2 | 5/2006 | Forbes et al. | |
| 7,132,691 | B1 | * 11/2006 | Tanabe et al. | ................. 257/79 |
| 7,194,176 | B2 | * 3/2007 | Takahashi et al. | ........... 385/132 |
| 7,233,710 | B2 | * 6/2007 | Wang et al. | .................... 385/8 |
| 2003/0015719 | A1 | 1/2003 | Haga | |
| 2005/0247954 | A1 | 11/2005 | Niki et al. | |
| 2006/0233969 | A1 | * 10/2006 | White et al. | ................ 427/576 |

OTHER PUBLICATIONS

Derwent Abstract and Figure for CN1603870A to Chen et al. published Apr. 26, 2005.*

Adachi, Chihaya, et al. "Molecular design a hole transport materials for obtaining high durability in organic . . .". Appl. Phys. Lett. vol. 66, No. 20, (1995), 2679-2681.

Ataev,B.M., et al. "Synthesis of epitaxial layers of zinc oxide on nonorienting substrates". Technical Physics, vol. 44, No. 11 (1999), 1391-1393.

Bhattacharya, P., et al. "Fabrication of stable wide-band-gap ZnO/MgO multilayer thin films". App. Phys. Lett., vol. 83, No. 10 (2003), 2010-2012.

Bundesmann, C., et al. "Raman scattering in ZnO thin films doped with Fe,Sb, Al, Ga, and Li". App. Phys. Lett. vol. 83, No. 10 (2003), 1974-1976.

(Continued)

*Primary Examiner*—Omar Rojas
(74) *Attorney, Agent, or Firm*—Brooks, Cameron & Huebsch, PLLC

(57) ABSTRACT

The present disclosure includes methods, devices, and systems having zinc oxide waveguides for optical signal interconnections. One optical signal interconnect system includes an oxide layer on a semiconductor substrate. A ZnO waveguide can be provided in the oxide layer and connected to a silicon detector to receive optical signals having a wavelength, for example, between 500 and 375 nanometers (nm).

29 Claims, 5 Drawing Sheets

OTHER PUBLICATIONS

Cheng, X.M., et al. Magnetic properties of epitaxial Mn-doped ZnO thin films. Journal of App. Phys. vol. 93, No. 10 (2003), 7876-7878.

Coutal, C., et al. "Fabrication and characterization of ITO thin films deposited by excimer laser evaporation". Thin Solid Films, vol. 288 (1996), 248-253.

Endo, Kazuhiko, et al. "Metal organic atomic layer deposition of a high-k gate dielectrics using plasma oxidation". Jpn. Journal of App. Phys. vol. 42 (2003), 685-687.

Gustafsson, G., et al. "Flexible light-emitting diodes made from soluble conducting polymers". Nature, vol. 357 (1992), 477-479.

Hamberg, I., et al. "Evaporated Sn-doped In2O3 films: Basic optical properties and applications . . . ". Journal of App. Phys, vol. 60, No. 11 (1986), 123-159.

Han, Jiaping, et al. "Varistor behaviour of Mn-doped ZnO ceramics". Journal of the European Ceramic Society, vol. 22 (2002), 1653-1660.

Hatanpaa, Timo, et al. "Properties of [Mg2(thd)4] as a Precursor for Atomic Layer Deposition of MgO Thin Films and Crystal . . . ". Chem. Mater., vol. 11 (1999), 1846-1852.

He, Yi, et al. "High-efficiency organic polymer light-emitting heterostructure devices on flexible plastic substrates". App. Phys. Lett., vol. 76, No. 6 (2000), 661-663.

Hirose, Y., et al. "Chemistry, diffusion and electronic properties of a metal/organic semiconductor . . . ". Appl. Phys. Lett., vol. 68, No. 2 (1996), 217-219.

Huang, R., et al. "The surface morphology of atomic layer deposited magnesia". Journal of Materials Science Letters, vol. 12 (1993), 1444-1446.

Ishibashi, S., et al. "Low resistivity indium-tin oxide transparent conductive films. II. Effect of sputtering . . . ". J. Vac. Sci. Technol., vol. 8 No. 3 (1990), 1403-1406.

Ishii, Hiroyuki, et al. "Growth and electrical properties of atomic-layer deposited ZrO2/Si-nitride . . . ". Journal of App. Phys., vol. 95, No. 2 (2004), 536-542.

Jeong, Sang-Hun, et al. "Photoluminescence dependence of ZnO films on Si (100) by radio-frequency . . . ". App. Phys. Lett. vol. 82, No. 16 (2003), 2625-2627.

Jonsson, A.K. et al. "Dielectric Permittivity and Intercalation Parameters of Li Ion Intercalated Atomic . . . ". Journal of the Electrochemical Society, vol. 151 (2004), 54-58.

Kim, H., et al. "Anode material based on Zr-doped ZnO thin films for organic light-emitting diodes". App. Phys. Lett. vol. 83, No. 18 (2003), 3809-3811.

Kim, H., et al. "Indium tin oxide thin films for organic light-emitting devices". App. Phys. Lett. vol. 74, No. 23 (1999), 3444-3446.

Kim, T.S., et al. "Splitting of the Valence Band for Polycrystalline ZnO". Journal of the Korean Physical Society, vol. 38, No. 1 (2001), 42-46.

Ko, H.J., et al. "Photoluminescence properties of ZnO epilayers grown on CaF2 (111) by plasma assisted . . . ". App. Phys. Lett., vol. 76, No. 14 (2000), 1905-1907.

Kukli, Kaupo, et al. "Low-Temperature Deposition of Zirconium Oxide-Based Nanocrystalline . . . ". Chem. Vap. Deposition, vol. 6, No. 6 (2000), 297-302.

Liu, Z.F., et al. "Epitaxial growth and properties of Ga-doped ZnO films grown by pulsed laser deposition". Journal of Crystal Growth, vol. 259 (2003), 130-136.

Look, D.C. "Recent advances in ZnO materials and devices". Materials Science and Engineering, vol. 80 (2001), 383-387.

Lu, Y.F., et al. "The effects of thermal annealing on ZnO thin films grown by pulsed laser deposition". Journal of App. Phys., vol. 88, No. 1 (2000), 498-502.

Lv, Maoshui, et al. "Transparent conducting zirconium-doped zinc oxide films prepared by rf magnetron sputtering". Applied Surface Science, vol. 252, (2005), 2006-2011.

Makino, T., et al. "Exiton spectra of ZnO epitaxial layers on lattice-matched substrates grown with laser-molecular . . . ". App. Phys. Lett., vol. 76, No. 24 (2000), 3549-3551.

Minemoto, Takashi, et al. "Preparation of Zn1-xMgxO films by radio frequency magnetron sputtering". Thin Solid Films, vol. 372 (2000), 173-176.

Ohomoto, A., et al. "MgxZn1-xO as a II-IV widegap semiconductor alloy". App. Phys. Lett. vol. 72, No. 19, (1998) 2466-2468.

Pearton, S.J., et al. "Recent advances in processing of ZnO". J. Vac. Sci. Technol. vol. 22, No. 3 (2004), 932-948.

Putkonen, Matti, et al. "Enhanced growth rate in atomic layer epitaxy deposition of magnesium oxide thin films". J. Mater. Chem., vol. 10 (2000), 1857-1861.

Putkonen, Matti, et al. "Surface-controlled growth of magnesium oxide thin films by atomic layer epitaxy". J. Mater. Chem., vol. 9 (1999), 2449-2452.

Qadri, S.B., et al. "Electron Beam deposition of ZrO2-ZnO films". Thin Solid Films, vol. 290-291 (1996), 80-83.

Quadri, S.B., et al. "Transparent conducting films of . . . ". Thin Solid Films, vol. 377-378 (2000), 750-754.

Rajagopal, A., et al. "Photoemission spectroscopy investigation of magnesium-Alq3 interfaces". Journal of App. Phys., vol. 84, No. 1 (1998), 355-358.

Ryu, Y. R., et al. "Optical and structural properties of . . . ". Journal of Applied Physics, vol. 88, No. 1 (2000), 201-204.

Ryu, Yungryel, et al. "ZnO-based LEDs begin to show full-color potential". Compound Semiconductor, http://compoundsemiconductor.net/articles/magazine/12/8/3/1 (4 pgs).

Sang, Baosheng, et al. "Growth of transparent conductive oxide ZnO Films by Atomic Layer Deposition". Jpn. J. App. Phys., vol. 35, (1996), 602-605.

Sanon, Geeta, et al. "Band-gap narrowing and band structure in degnerate tin oxide . . . ". Physical Review B, vol. 44, No. 11 (1991), 5672-5680.

Serneluis, B.E., et al. "Band-gap tailoring of ZnO by means of heavy Al doping". Physical Reviews B, vol. 37, No. 17 (1988), 10244-10248.

Shan, F.K., et al. "Band gap energy of pure and Al-doped ZnO thin films". Journal of the European Ceramic Society, vol. 24 (2004), 1869-1872.

Shan, F.K., et al. "Blueshift of near band edge emission in Mg doped ZnO thin films and aging". Journal of Applied Physics, vol. 95, No. 9 (2004), 4772-4776.

Shan, F.K., et al. "Optical properties of As doped ZnO thin films prepared by pulsed . . . ". Journal of the European Ceramic Society, vol. 24 (2004), 1861-1864.

Shan, F.K., et al. "Optical properties of pure and Al doped ZnO thin films fabricated . . . ". Thin Solid Films, vol. 435 (2003), 174-178.

Shan, F.K., et al. "Structural properties of Zinc Oxide thin films by fabrication . . . ". Journal of the Korean Physical Society, vol. 42 (2003), 1157-1160.

Shan, F.K., et al. "Substrate effects of ZnO thin films prepared by PLD technique". Journal of the European Ceramic Society, vol. 24 (2004), 1015-1018.

Sneh, Ofer, et al. "Thin film atomic layer deposition equipment for semiconductor processing". Thin Solid Films, vol. 402 (2002), 248-261.

So, Soon-Jin, et al. "Improvement in the electrical stability of semiconducting ZnO . . . ". Journal of the Korean Physical Society, vol. 40, No. 5 (2002), 925-929.

Srikant, V., et al. "On the optical band gap of zinc oxide". Journal of Applied Physics, vol. 83, No. 10 (1998), 5447-5451.

Valentini, Antonio, et al. "Dielectric zinc oxide films characterization for optical waveguide". Proc. SPIE, vol. 1125 (1989), 36-40.

Youm, Minsoo, et al. "Metal oxide semiconductor field effect transistor characteristics with . . . ". Jpn. J. Applied Physics, vol. 42 (2003), 5010-5013.

Yu, S.F., et al. "Design and Fabrication of Zinc Oxide Thin-Film Ridge Waveguides . . . ". IEEE Journal of Quantum Electronics, vol. 40, No. 4 (2004), 406-412.

Yu, S.F., et al. "Ultraviolet amplified spontaneous emission from zinc oxide ridge . . . ". App. Phys. Lett. vol. 83, No. 21 (2003), 4288-4290.

Yu, S.F., et al. "Zinc Oxide thin-film random lasers on silicon substrate". App. Phys. Lett. vol. 84, No. 17 (2004), 3244-3246.

Yun, Sun Jin, et al. "Effects of plasma on characteristics of zirconium oxide films . . . ". Electrochemical and Solid-State Letters, vol. 8, No. 11 (2005), 47-50.

United States Patent and Trademark Office Action for U.S. Appl. No. 11/717,770 dated Feb. 20, 2009 (23 pgs.).

* cited by examiner

ZINC OXIDE OPTICAL WAVEGUIDES

TECHNICAL FIELD

The present disclosure relates generally to semiconductor devices and, more particularly, to zinc oxide optical waveguides.

BACKGROUND

A continuing challenge in the semiconductor industry is to find new, innovative, and efficient ways of forming electrical connections with and between circuit devices which are fabricated on the same and on different wafers or dies. In addition, continuing challenges are posed to find and/or improve upon the packaging techniques utilized to package integrated circuitry devices.

One technique to alleviate these problems is optical waveguides through a wafer for signal interconnection of the front and back surfaces of a wafer. The optical waveguides include a highly reflective material that is deposited so as to clad an inner surface of the high aspect ratio holes which may be filled with air or a material with an index of refraction that is greater than one. Wave guiding is reflection at the interface of metal surrounding the core. These metal confined waveguides are used to transmit signals between functional circuits on the semiconductor wafer and functional circuits on the back of the wafer or beneath the wafer.

Another technique to address the above issues is to use optical fiber interconnects through a wafer for signal interconnection of the front and back surfaces of a wafer. This includes an integrated circuit with a number of optical fibers that are formed in high aspect ratio holes. The high aspect ratio holes extend through a semiconductor wafer. The optical fibers include a cladding layer and a core formed in the high aspect ratio hole. Wave guiding is provided by total internal reflection at the interface between the higher index of refraction core and the lower index of refraction of the material in which the guide is embedded. These optical fibers are used to transmit signals between functional circuits on the semiconductor wafer and functional circuits on the back of the wafer or beneath the wafer.

For signal interconnections over longer distances, for instance between different circuit die or modules, optical waveguides or fibers can be used. Previous approaches disclose a waveguide structure formed with a three-dimensional (3D) photonic crystal. The 3D photonic crystal comprises a periodic array of voids formed in a solid substrate. The voids are arranged to create a complete photonic bandgap. The voids may be formed using a technique called "surface transformation," which involves forming holes in the substrate surface, and annealing the substrate to initiate migration of the substrate near the surface to form voids in the substrate. A channel capable of transmitting radiation corresponding to the complete bandgap is formed in the 3D photonic crystal, thus forming the waveguide. The waveguide may be formed by interfacing two 3D photonic crystal regions, with at least one of the regions having a channel. Alternatively a photonic crystal optical fiber made up of an array of conventional hollow core optical fibers may be employed. In this example, the array of optical fibers omits at least one fiber to form a central hollow core. The fiber works on the principle of two-dimensional photonic crystals to confine the radiation in a guided wave within the central hollow core. The fiber has a true photonic bandgap in which radiation of a particular energy or wavelength is totally forbidden, thereby providing a very high reflection coefficient to radiation incident the walls of the central hollow core over a select range of angles. The central hollow core allows for radiation propagation with minimal absorption.

In another approach, optical waveguides can be formed using rectangular or square strips of dielectric material embedded in a dielectric with a lower index of refraction. Wave guiding is provided by total internal reflection at the interface between the higher index of refraction core and the lower index of refraction of the material in which the guide is embedded. ZnO has been characterized for use as optical waveguides and directional amplified spontaneous ultraviolet emission near the bandgap energy has been observed from ZnO thin-film ridge waveguides for illumination (but not for signaling).

DETAILED DESCRIPTION

Embodiments of the present disclosure illustrate techniques for using Zinc Oxide (ZnO) optical waveguides embedded in silicon oxide on silicon wafers for optical signal interconnections. The ZnO optical waveguides operate by receiving a signal from an optical emitter. Then transmitting this optical signal through the waveguide to a detector. The detector positioned at the opposite end of the optical waveguide as the optical emitter receives the optical signal. The wavelengths that the optical emitter sends to the optical waveguide will be less than the bandgap of ZnO. The bandgap of the optical emitter and the optical waveguide must differ so as to avoid absorption of the optical emitter signal by the optical waveguide. The ZnO material of the optical waveguide will have a very low loss but can still be high enough that silicon detectors will have strong absorption.

Figure 1A:
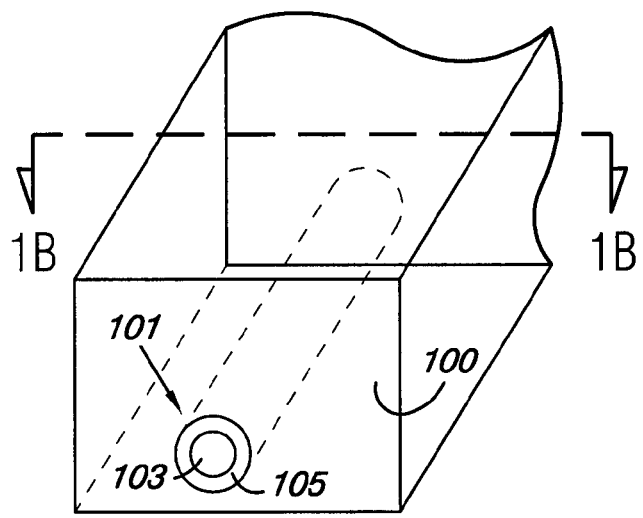
FIG. 1A illustrates an optical fiber waveguide with an inner core and outer cladding.

Several examples of the previously described optical waveguides and fibers are provided in FIGS. 1-5 and described in the following paragraphs. The optical fiber, as shown in FIG. 1A, has a reflective layer that is formed on the inner surface of optical fiber 101. In one embodiment, reflective layer 105 comprises a metallic mirror that is deposited with a self-limiting deposition process. This produces a reflective surface for optical fiber 101 that is substantially uniform.

Figure 1B:
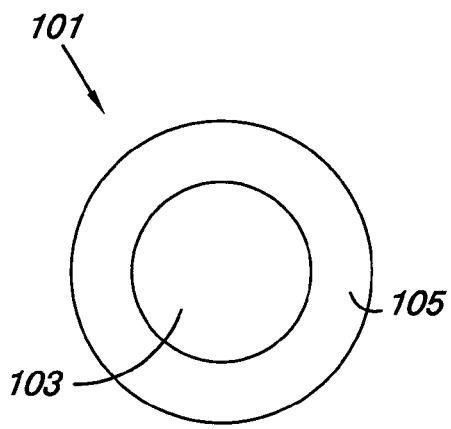
FIG. 1B illustrates a cross-sectional view of an optical fiber waveguide with an inner core and outer cladding.

In FIG. 1B, optical fiber 101 comprises a cladding layer 105 that separates the core 103 from the semiconductor wafer. In this structure, the semiconductor wafer acts as the outer sheath for optical fiber 101. Various materials can be used to form core 103 and cladding layer 105. The core 103 can be comprised of a material with a higher index of refraction than the material of cladding layer 105 and thus provides normal optical fiber waveguide characteristics.

Figure 2:
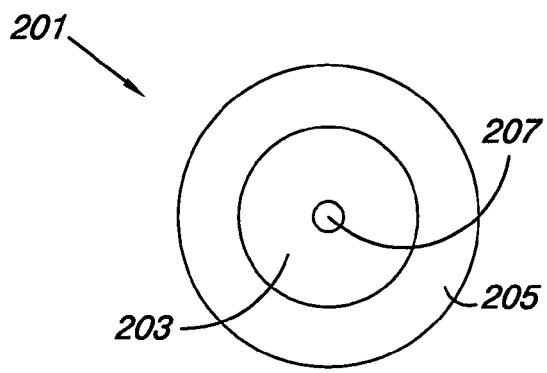
FIG. 2 illustrates a cross-sectional view of an optical fiber waveguide with an inner core, an outer cladding, and a opening through the center.

FIG. 2 illustrates an optical fiber 201 which includes a cladding layer 205 that separates the core 203 from the semiconductor wafer. In this structure, the semiconductor wafer acts as the outer sheath for optical fiber 201. Various materials can be used to form core 203 and cladding layer 205. The core 203 comprises a material with a higher index of refraction than the material of cladding layer 205 and thus provides normal optical fiber waveguide characteristics. Also, an opening 207 runs through the length of the core 203. This opening when having a diameter of less than 0.59 times the wavelength of the light transmitted over the optical fiber 201 the light will still be guided by core 203.

Since the optical fiber is formed in a wafer of semiconductor material, absorption and radiation in the semiconductor wafer can affect the operation of the optical fiber. For example, if the wavelength of the light transmitted in optical fiber 101 is greater the absorption edge of the semiconductor wafer, e.g., 1.1 microns for silicon, then semiconductor wafer will not absorb the light transmitted in optical fiber 101. However, due to the large change in index of refraction at the interface between cladding layer 105 and the semiconductor wafer, some radiation loss occurs into the semiconductor wafer. This case is depicted, for example, in FIG. 3.

Figure 3:
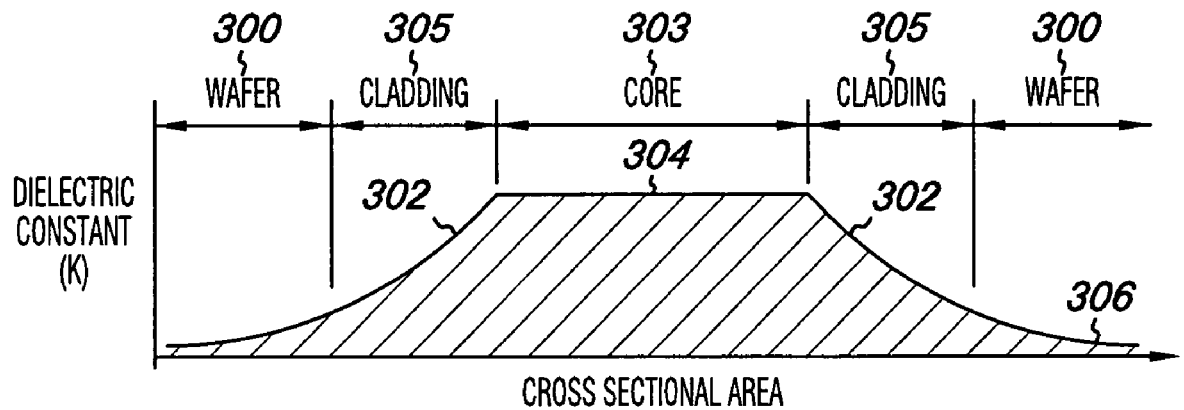
FIG. 3 illustrates the index of refraction across the cross section of the optical fiber waveguide in FIG. 1B.

In the graph of FIG. 3, the magnitude of the radiation in optical fiber 101 along a diameter of optical fiber 101 is illustrated. In the region of core 103, indicated at 304, optical waves are guided with no substantial loss along the length of optical fiber 101. Evanescent fields are present in the region of cladding layer 105 indicated at 305. These evanescent fields drop off to insignificant levels as indicated at 300 in the surrounding semiconductor wafer.

Figure 4:
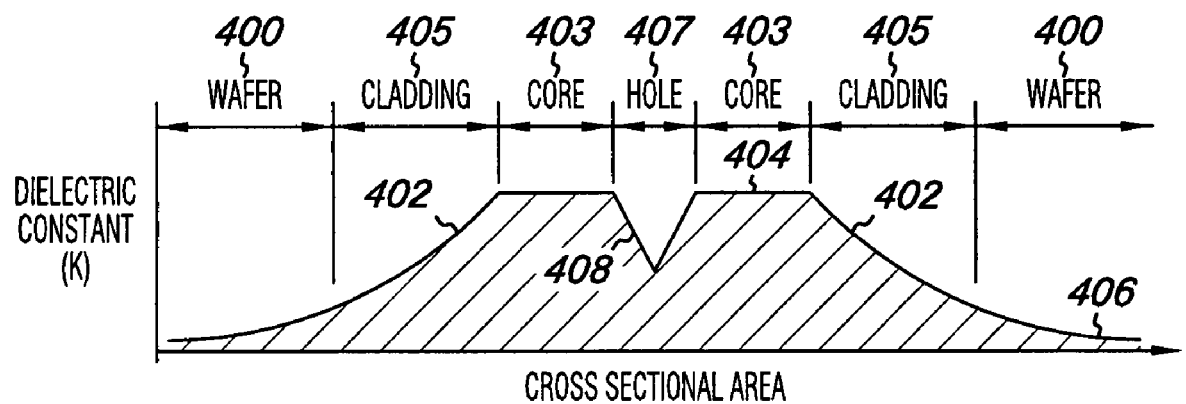
FIG. 4 illustrates the index of refraction across the cross section of the optical fiber waveguide in FIG. 2.

FIG. 4 is a graph that illustrates the magnitude of the radiation in an optical fiber of the type shown in FIG. 2 along a diameter of the optical fiber. In the region of opening 207, an evanescent field is present as indicated at 408. In the region of core 203, radiation in the optical fiber is guided along the length of the fiber without an adverse loss in intensity. Evanescent fields are present in the region of cladding layer 205 as indicated at 402. These evanescent fields drop off to negligible levels as indicated at 406 in the surrounding semiconductor wafer.

Figure 5:
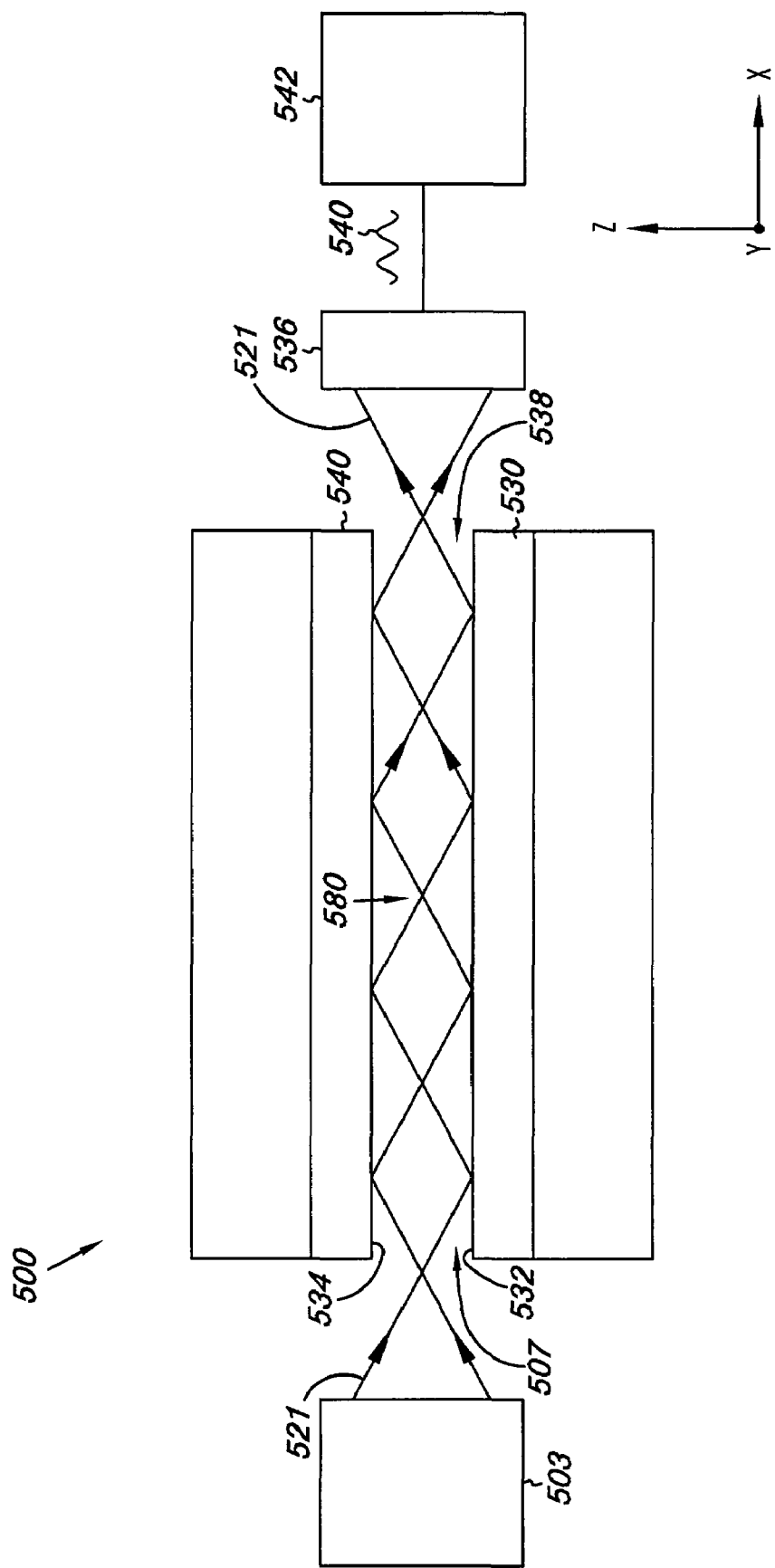
FIG. 5 illustrates an emitter sending a signal through a waveguide to a receiver.

With reference to FIG. 5, waveguide optical system 500 includes a radiation source 503 operatively coupled to an input end 507 of 3D photonic waveguide 580 so that radiation 521 emitted from the radiation source is transmitted down the waveguide. Radiation 521 has a wavelength within the photonic bandgap of 3D photonic crystal regions 530 and 540 that define waveguide 580. In an example embodiment, radiation source 503 is a laser, such as a diode laser or vertical cavity surface emitting laser (VCSEL).

Radiation 521 is confined in 3D over the entire range of possible propagation angles due to the omnidirectional reflection by each complete bandgap crystal surface e.g., lower channel wall 532, the channel sidewalls (not shown), and an upper surface 534 defining waveguide 580. Because waveguide 580 may contain either air, another gas (e.g., nitrogen) or a vacuum, the waveguide is expected to have a transmission loss comparable to or better than today's low loss fibers (0.3 dB per kilometer) used for long-distance optical communication. Also, bending losses from bends should be remarkably low as compared to conventional waveguides because the reflection mechanism of complete bandgap photonic crystals is not sensitive to incident angle. This allow for waveguide 580 to have bends of up to 90 degrees, providing more design latitude in fabricating waveguide-based integrated circuits optical systems such as couplers, Y-junctions, add-drop multiplexers, and the like.

In FIG. 5, a photodetector 536 is operatively coupled to an output end 538 of waveguide 580 to receive and detect radiation 521 having traveled down the waveguide, and to generate an electrical signal (i.e., a photocurrent) 540 in response thereto. Connected to photodetector 536 is an electronic system 542 operable to receive and process electrical signal 540.

In various embodiments of the present disclosure, ZnO optical waveguides are embedded in silicon oxide on silicon wafers for optical signal interconnections. The ZnO optical waveguides operate by receiving a signal from an optical emitter. The optical signal is then transmitted through the waveguide to a detector. The detector is positioned at the opposite end of the optical waveguide as the optical emitter receives the optical signal. The bandgap of the optical emitter and the optical waveguide must differ so as to avoid absorption of the optical emitter signal by the optical waveguide. As such, the wavelengths that the optical emitter sends to the optical waveguide will be less than the band gap of ZnO to avoid absorption of the optical emitter signal. The ZnO material of the optical waveguide will have a very low loss but can still be high enough that silicon detectors will have strong absorption.

Figure 6:
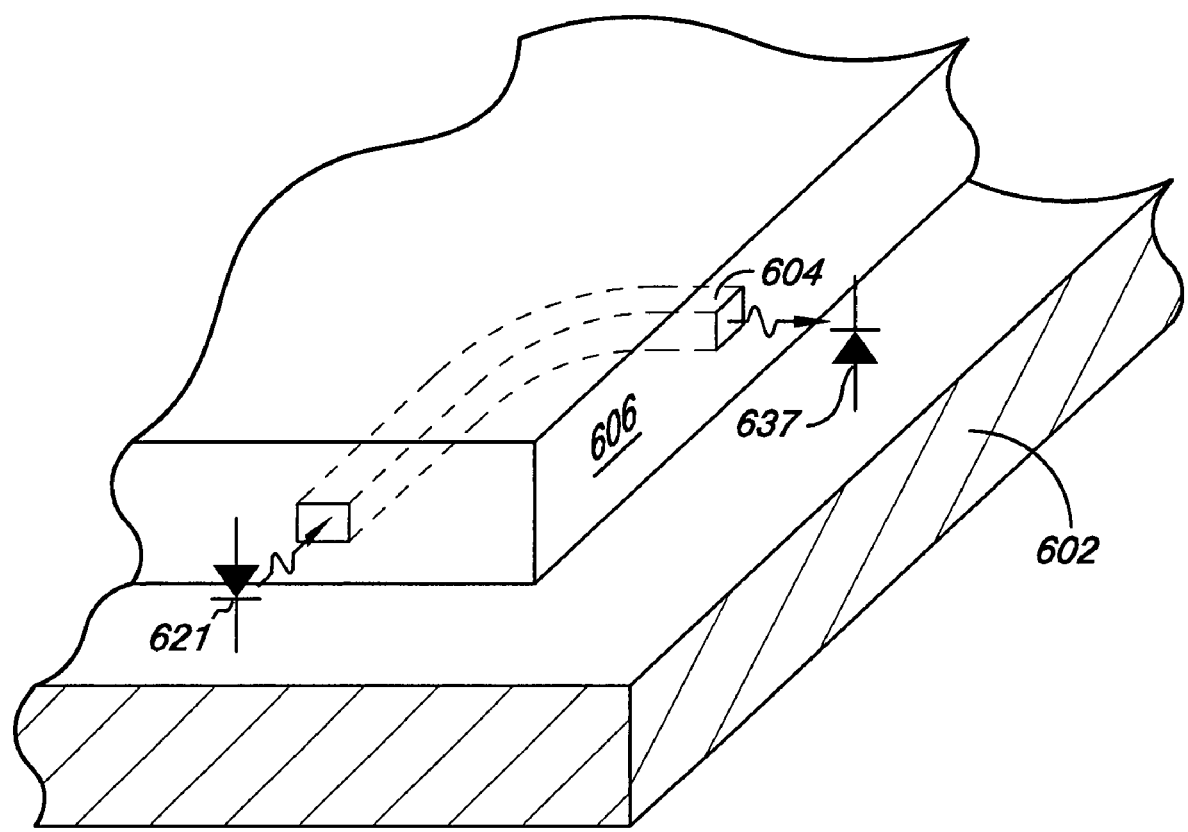
FIG. 6 illustrates a Zinc Oxide (ZnO) waveguide embedded in silicon oxide on a silicon substrate according to an embodiment of the present disclosure.

FIG. 6 illustrates an embodiment of a ZnO waveguide embedded in silicon oxide on a silicon substrate. Various embodiments of an optical waveguide 604 use an emitter 621 to send a signal to the optical waveguide and a detector 637 to receive the signal transmitted through the optical waveguide 604. In various embodiments the emitter 621 is coupled to the input of a ZnO waveguide 604. Example emitters can include an optical emitter, a light emitting diode, or laser diode, along with various other emitters. In the embodiment illustrated in FIG. 6, the ZnO optical waveguide 604 is embedded in silicon oxide 606 on a silicon substrate 602. The silicon oxide 606 and silicon substrate 602 are used to form integrated circuits which are connected by the optical waveguide through the transmission of the optical signal in the optical waveguide. A silicon detector 637 can be used at the output of the waveguide to receive the optical signal. The silicon detector converts the optical signal back into an electrical signal to drive another part of the integrated circuit. The integrated circuits on the silicon substrate are electrically connected through this process.

The ZnO waveguide carries a signal from the light emitter 621 to the detector 637. The wavelength of the signal from the light emitter 621 is less than the bandgap of the ZnO, 3.3 eV, but larger than the bandgap of the silicon, so it will be strongly absorbed by the silicon detector. The light emitter, if a light emitting diode 621, can be any one of many possible III-V semiconductor diodes or lasers which are bonded to the silicon wafer.

If a ZnO based emitter with a bandgap energy of 3.3 eV is used then it will emit light at 380 nm which would be absorbed by a ZnO waveguide because of their common bandgap energies. To alleviate this problem, the ZnO waveguide can be doped with Mg to form a ZnMgO waveguide. This ZnMgO waveguide has a larger bandgap than ZnO and will not absorb an optical signal with a wavelength of 380 nm, making it a compatible waveguide for use with a ZnO emitter. Therefore, a doped ZnO optical waveguide can be used in a given configuration with an optical emitter having a certain bandgap energy and wavelength and an optical detector having a strong absorption coefficient at a given wavelength to facilitate transmission of the optical signal through the waveguide without absorption of the signal.

The ZnO waveguide structure in the embodiment illustrated in FIG. 6 begins with a silicon substrate 602. A silicon oxide layer 606 is then formed on the silicon substrate 602. An opening in the silicon oxide layer 606 is formed, e.g. through photolithographic or other techniques, to define the geometry of the ZnO waveguide 604. The ZnO waveguide 604 can then be formed in the silicon oxide layer 606 through irregular zinc oxide grains that are formed through the post-growth annealing of high-crystal-quality zinc oxide thin films obtained from a filtered cathodic vacuum technique. In various embodiments, a hybrid beam deposition (HBD) process can be used to form the ZnO waveguide 604 in the silicon oxide layer 606. This process offers a viable approach to growing doped and undoped ZnO films, alloys, and devices. The HBD process is comparable to molecular beam epitaxy (MBE), however, it uses a zinc oxide plasma source, which is produced by illuminating a polycrystalline ZnO target with either a pulsed laser or an electron beam and a high pressure oxygen plasma created by a radio-frequency oxygen generator.

A hybrid beam deposition (HBD) system utilizes a combination of pulsed laser deposition (PLD) technique and equipment that provides a radical oxygen rf-plasma stream to effectively increase the flux density of available reactive oxygen at a deposition substrate for the effective synthesis of metal oxide thin films. The HBD system further integrates molecular beam epitaxy (MBE) and/or chemical vapor deposition (CVD) techniques and equipment in combination with the PLD equipment and technique and the radical oxygen rf-plasma stream to provide elemental source materials for the synthesis of undoped and/or doped metal oxide thin films as well as synthesis of undoped and/or doped metal-based oxide alloy thin films.

A hybrid beam deposition system for synthesizing metal oxide films, doped metal oxide films, metal-based oxide alloy films, and doped metal-based oxide alloy films under predetermined synthesis conditions consists of a deposition chamber used as a containment chamber for synthesis of the metal oxide films, doped metal oxide films, metal-based oxide alloy films, and doped metal-based oxide alloy films under the predetermined synthesis conditions. A target assembly is used to mount a metal oxide target material within the deposition chamber and an rf reactive gas source introduces an rf oxygen plasma stream into the deposition chamber within a predetermined dynamical pressure range. A metal oxide plasma generating subsystem then interacts with the metal oxide target material to generate a high-energy directional metal oxide plasma plume within the deposition chamber. A source material subsystem generates, as required, one or more directed streams of elemental source materials into the deposition chamber for the synthesis of doped metal oxide films, metal-based oxide alloy films, and doped metal-based oxide alloy films and a substrate assembly positions. A substrate having a synthesis surface within the deposition chamber in such manner that the rf oxygen plasma stream, the high-energy directional metal oxide plasma plume, and the one or more directed streams of elemental source materials optimally are directed in selected combination or sequences at the synthesis surface of the substrate. This is done for the synthesis of metal oxide films, doped metal oxide films, metal-based oxide alloy films, and doped metal-based oxide alloy films on the substrate within the deposition chamber under the predetermined synthesis conditions.

Also, in other embodiments the ZnO waveguide can be formed in the silicon oxide layer 606 by metal organic chemical vapor deposition (MO-CVD). A large amount of plasma energy is applied to the silicon substrate in a process for depositing a ZnO thin film by sputtering. Hydrogen is dissociated by this energy at low temperature as well as a thin film buffer layer, in which an amorphous material and fine crystals are mixed, is formed by easing the difference of lattice intervals between silicon and zinc oxide.

In various embodiments, the system for depositing zinc oxide films by MO-CVD comprises a chamber containing a heated table, the introduction of the reactants into the chamber in gaseous form and a regulated pumping system to provide a dynamic gas flow through the chamber. An organozinc compound and oxidant are carried into the chamber in individual streams of an inert carrier gas. Mixing of the organozinc vapor and oxidant occurs before contact with the heated surface of the substrate in the space between the point of introduction thereof and the heated substrate surface. Reaction between the organozinc compound and oxidant results in decomposition of the organozinc compound to produce zinc oxide, which is deposited upon the substrate as a thin film, with $CO_2$, CO and volatile hydrocarbons as possible byproducts of the reaction. The zinc oxide film contains hydrogen and may contain a group III element where a volatile compound of a group III element is also introduced into the deposition chamber. Again, hydrogen is dissociated by this energy at low temperature as well as a thin film buffer layer, in which an amorphous material and fine crystals are mixed, is formed by easing the difference of lattice intervals between silicon and zinc oxide.

In other embodiments, the ZnO waveguide can be formed in the silicon oxide layer 606 by atomic layer deposition (ALD). ZnO films are grown by ALD using diethylzinc (DEZn) and $H_2O$ as reactant gases. Self-limiting growth occurs at substrate temperatures ranging from 105° C. to 165° C. The self-limiting growth is also achieved when the flow rates of DEZn and $H_2O$ were varied caused by the saturation of all the reaction and purging steps. It was found that the orientation and surface morphology of the films is strongly dependent on the substrate temperature. The mobility of films is higher than that of films grown by MO-CVD.

The ALD process begins by introducing gaseous precursors on at a time to the substrate surface, and between the pulses the reactor is purged with an inert gas or evacuated. In the first reaction step the precursor is saturatively chemisorbed at the substrate surface, and during the subsequent purging the precursor is removed from the reactor. In the second step, another precursor is introduced on the substrate and the desired film growth reaction takes place. After that the reaction byproducts and the precursor excess are purged out from the reactor. When the precursor chemistry is favorable, i.e. the precursor absorb and react with each other aggressively, an ALD cycle can be performed in less than one second in the properly designed flow type reactors.

In the various embodiments of the present disclosure, HBD, ALD, and MO-CVD can all be used to form a ZnO waveguide, as well as doped ZnO waveguides, such as the ZnMgO waveguide described above.

Figure 7:
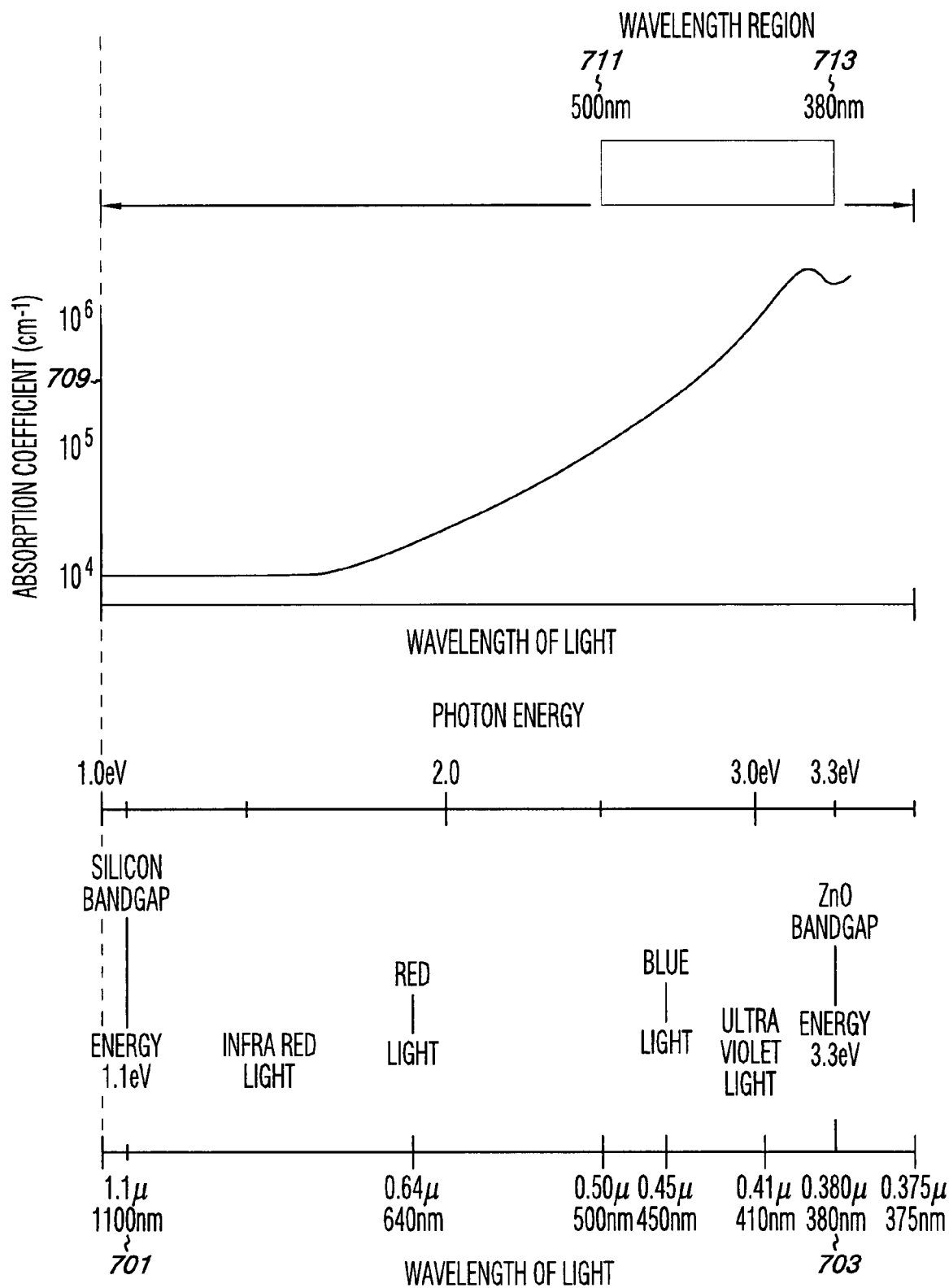
FIG. 7 illustrates the wavelengths and photon energies of the signals carried by the ZnO waveguide in the embodiment illustrated in FIG. 6.

FIG. 7 demonstrates the wavelengths of operation for various embodiments of an optical interconnections with ZnO waveguides. Silicon photodiode receivers will have strong absorption in the range of wavelengths from 500 nm 711 to 380 nm 713. Any signal that can be emitted and transmitted through the optical waveguide in this range of 500 nm to 380 nm can be used with a silicon detector. The optimum absorption coefficient for a silicon detector occurs at around 410 nm in the ultraviolet wavelength range, which corresponds to a photon energy of approximately 3.0 eV. The absorption coefficient of the silicon photodiode receivers will be $10^5$ cm$^{-1}$ for signals with a wavelength of 410 nm and a photon energy of 3.0 eV. If a ZnO based emitter with a bandgap energy of 3.3 eV is used, then it will emit light at 380 nm 703 which will be absorbed in the ZnO waveguide because of their common bandgap energies. In the case where a ZnO emitter is used, the ZnO waveguide can be doped with Mg and to form a ZnMgO waveguide to allow transmission of the signal from the ZnO emitter. ZnMgO has a larger bandgap than ZnO and will not absorb at 380 nm, therefore a ZnO emitter and a ZnMgO waveguide are compatible to form the signaling system described herein.

CONCLUSION

Methods, devices, and systems for zinc oxide optical waveguides have been shown. The zinc oxide optical waveguides are embedded in silicon oxide on silicon wafers for optical signal interconnections.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for fanning an optical waveguide, comprising:
   forming an oxide layer on a semiconductor substrate;
   defining a waveguide geometry in the oxide layer;
   forming a Zinc Oxide (ZnO) layer in the defined waveguide geometry; and
   doping the ZnO layer with Mg to form a MgZnO layer to carry an optical signal to a silicon detector.

2. The method of claim 1, wherein the method includes electrically interconnecting a number of integrated circuits formed on the semiconductor substrate with the optical waveguide.

3. The method of claim 1, wherein forming the ZnO layer in the defined waveguide geometry includes growing the ZnO layer using a hybrid beam deposition (HBD) process.

4. The method of claim 1. wherein forming the ZnO layer in the defined waveguide geometry includes growing the ZnO layer using a Metalorganic Chemical Vapor Deposition (MO-CVD) process.

5. The method of claim 1, wherein fanning the ZnO layer in the defined waveguide geometry includes depositing the ZnO layer using an atomic layer deposition (ALD) process.

6. A method for forming an optical signal interconnect system, comprising:
   forming a Zinc Oxide (ZnO) waveguide in an oxide layer on a silicon substrate for a signal interconnect;
   coupling an optical emitter to an input of the ZnO waveguide;
   coupling a silicon diode to an output of the ZnO waveguide; and
   electrically interconnecting a number of integrated circuits formed on the silicon substrate with the ZnO waveguide.

7. The method of claim 6, wherein coupling the optical emitter includes coupling an optical emitter formed from among Group III to Group V semiconductor materials.

8. The method of claim 6, wherein the method includes:
   coupling a ZnO based emitter to the input of the ZnO waveguide; and
   doping the ZnO waveguide with Magnesium (Mg).

9. The method of claim 6, wherein forming the ZnO waveguide includes growing a ZnO layer using a hybrid beam deposition (HBD) process.

10. The method of claim 6, wherein forming the ZnO waveguide includes growing a ZnO layer using a Metalorganic Chemical Vapor Deposition (MO-CVD) process.

11. The method of claim 6, wherein forming the ZnO waveguide includes depositing a ZnO layer using an atomic layer deposition (ALD) process.

12. An optical signal interconnect system, comprising:
   an oxide layer, with a defined waveguide geometry, on a semiconductor substrate;
   a ZnO waveguide provided in the defined waveguide geometry of the oxide layer and connected to a silicon photodiode receiver to receive optical signals having a wavelength between 500 and 355 nanometers (nm); and
   a number of integrated circuits on the semiconductor substrate electrically interconnected by the ZnO waveguide.

13. The optical signal interconnect system of claim 12, wherein the interconnect system includes an optical emitter, selected from the group of a light emitting diode and a laser diode, coupled to the ZnO waveguide.

14. The optical signal interconnect system of claim 13, wherein a wavelength of emission from the optical emitter has a photon energy which is less than a bandgap energy of the ZnO waveguide but larger than a bandgap energy of the silicon photodiode receiver.

15. The optical signal interconnect system of claim 13, wherein the optical emitter is selected from among Group III to Group V semiconductor materials.

16. The optical signal interconnect system of claim 13, wherein a wavelength of emission from the optical emitter is approximately 410 nm and has a photon energy of approximately 3.0 eV.

17. The optical signal interconnect system of claim 13, wherein the optical emitter is a ZnO-based light emitting diode having a bandgap energy of approximately 3.3 eV, and wherein the ZnO waveguide is doped with Magnesium (Mg) to provide a ZnMgO waveguide.

18. An optical signal interconnect system, comprising:
   a MgZnO waveguide provided in a defined waveguide geometry of an oxide layer on a semiconductor substrate;

an optical emitter coupled to an input of the MgZnO waveguide; and a silicon photo diode receiver coupled to an output of the MgZnO waveguide capable of receiving optical signals having a wavelength between 500 and 355 nanometers (nm).

19. The optical signal interconnect system of claim 18, wherein the optical emitter emits an optical signal at less than 3.3 eV with a wavelength between 380 nm and 500 nm.

20. The optical signal interconnect system of claim 19, wherein the optical emitter emits an optical signal having a wavelength of approximately 410 nm and having a photon energy of approximately 3.0 eV.

21. The optical signal interconnect system of claim 18, wherein the optical emitter is selected from among Group III to Group V semiconductor materials.

22. The optical signal interconnect system of claim 18, wherein the optical emitter emits a wavelength having a photon energy which is less than a bandgap energy of the MgZnO waveguide but larger than a bandgap energy of the silicon photodiode receiver.

23. The optical signal interconnect system of claim 18, including a number of integrated circuits on the semiconductor substrate electrically interconnected by the MgZnO waveguide.

24. The optical signal interconnect system of claim 23, wherein the optical emitter is a ZnO-based emitter which emits a wavelength of approximately 380 nm.

25. A method for operating an optical signal interconnect system, comprising:

operating an optical emitter coupled to an input of a ZnO waveguide provided in a defined waveguide geometry of an oxide layer on a semiconductor substrate to emit signals having a wavelength between 500 and 355 nanometers (nm);

using a silicon photodiode receiver coupled to an output of the ZnO waveguide to detect optical signals and convert the optical signals to electrical signals; and using the electrical signals to electrically interconnect a number of integrated circuits formed on the semiconductor substrate.

26. The method of claim 25, wherein the method includes operating the optical emitter to emit signals having a photon energy of less than 3.3 eV.

27. The method of claim 25, wherein the method includes operating the optical emitter to emit signals having a wavelength of approximately 410 nm and a photon energy of approximately 3.0 eV.

28. The method of claim 25, wherein the method includes operating the optical emitter to emits signals having a photon energy which is less than a bandgap energy of the ZnO waveguide but larger than a bandgap energy of the silicon photodiode receiver.

29. The method of claim 25, wherein the method includes operating an optical emitter is selected from among Group III to Group V semiconductor materials.

\* \* \* \* \*

UNITED STATES PATENT AND TRADEMARK OFFICE
CERTIFICATE OF CORRECTION

PATENT NO. : 7,529,460 B2  Page 1 of 1
APPLICATION NO. : 11/717463
DATED : May 5, 2009
INVENTOR(S) : Forbes et al.

It is certified that error appears in the above-identified patent and that said Letters Patent is hereby corrected as shown below:

On the face page, in field (56), under "Other Publications", in column 2, line 3, delete "design a" and insert -- design of --, therefor.

In column 7, line 53, in claim 1, delete "fanning" and insert -- forming --, therefor.

In column 8, line 1, in claim 4, delete "1." and insert -- 1, --, therefor.

In column 8, line 5, in claim 5, delete "fanning" and insert -- forming --, therefor.

In column 9, line 3, in claim 18, delete "photo diode" and insert -- photodiode --, therefor.

Signed and Sealed this

Twenty-eighth Day of July, 2009

JOHN DOLL
*Acting Director of the United States Patent and Trademark Office*